United States Patent [19]

Suzuki et al.

[11] Patent Number: 4,584,552
[45] Date of Patent: Apr. 22, 1986

[54] HALL ELEMENT WITH IMPROVED COMPOSITE SUBSTRATE

[75] Inventors: Shinichi Suzuki; Masami Mochizuki; Takashi Suemitsu, all of Yamanashi, Japan

[73] Assignee: Pioneer Electronic Corporation, Tokyo, Japan

[21] Appl. No.: 478,123

[22] Filed: Mar. 23, 1983

[30] Foreign Application Priority Data

Mar. 26, 1982 [JP] Japan .................................. 57-49693
Mar. 26, 1982 [JP] Japan .................................. 57-49694
Apr. 2, 1982 [JP] Japan .................................. 57-55752

[51] Int. Cl.$^4$ ............................................. H01L 43/00
[52] U.S. Cl. ............................. 338/32 H; 338/32 R; 338/7; 338/334
[58] Field of Search .................. 338/32 H, 32 R, 9, 7, 338/314, 334; 357/27

[56] References Cited

U.S. PATENT DOCUMENTS

| | | | |
|---|---|---|---|
| 2,855,549 | 10/1958 | Kuhrt et al. | 357/27 |
| 3,315,205 | 4/1967 | Kuhnlein et al. | 338/32 H |
| 3,410,721 | 11/1968 | Hini | 338/32 R |
| 3,823,354 | 7/1974 | Janssen | 357/27 |
| 4,128,681 | 12/1978 | Kotera et al. | 427/87 |
| 4,251,795 | 2/1981 | Shibasaki et al. | 338/32 R |
| 4,281,357 | 7/1981 | Lee | 360/125 |

FOREIGN PATENT DOCUMENTS

| | | | |
|---|---|---|---|
| 2844420 | 4/1980 | Fed. Rep. of Germany | 338/32 H |
| 60086 | 5/1977 | Japan | 338/334 |
| 55-118683 | 9/1980 | Japan | 338/32 H |
| 57-197884 | 12/1982 | Japan | 357/27 |

*Primary Examiner*—C. L. Albritton
*Assistant Examiner*—M. M. Lateef
*Attorney, Agent, or Firm*—Sughrue, Mion, Zinn, Macpeak and Seas

[57] ABSTRACT

A magnetoelectric transducer includes a high mobility semiconductor thin film formed on a layer such as an alumina film. Processing to form the device is improved by simultaneous patterning of the semiconductor thin film and an electrode layer. Improved resistance to the effects of heat are obtained by using a highly heat conductive substrate. Integrally with the substrate there may be formed an element such as a series resistor for temperature compensation of the magnetic sensor of the transducer.

15 Claims, 24 Drawing Figures

HALL ELEMENT WITH IMPROVED COMPOSITE SUBSTRATE

BACKGROUND OF THE INVENTION

The present invention relates to a magnetoelectric transducer of improved reliability and yield, and to a method of producing a magnetoelectric transducer capable of remarkably reducing the number of process steps required in manufacture.

Magnetoelectric transducers are elements used to convert a change of magnetic field into an electric signal, and are widely used in many applications as magnetic sensors.

A Hall element is used for the magnetoelectric transducer, and mica or ferrite is widely used as the substrate of the magnetoelectric transducer.

The present invention also relates to a Hall element formed with a magneto-sensitive portion and a compensation resistor for restricting any variation of the output voltage of the Hall element due to a change of temperature, these two elements being formed on the same substrate.

Figure 1:
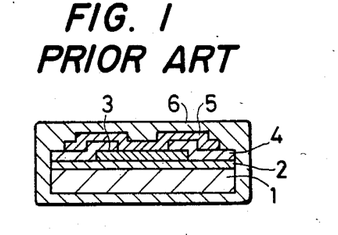
FIG. 1 is a schematic sectional view of a conventional magnetoelectric transducer.

FIG. 1 is a schematic sectional view showing one example of a conventional magnetoelectric transducer. In FIG. 1, a base layer 2 is deposited on the surface of a substrate 1, and a semiconductor thin film 3 is formed by crystal growth on the surface of the base layer 2. Further, an electrode thin film 4 is formed on the surface of the semiconductor thin film 3 using mask evaporation such that a portion of the surface of the semiconductor thin film 3 is retained, and a protective thin film 5 is then formed on the surface of the electrode thin film 4 and the partial surface of the semiconductor thin film 3 using mask evaporation. The peripheral surfaces of the element thus constructed are integrally enveloped by a molding resin 6.

Most conventional magnetoelectric transducers use InSb, according to a method where a single crystal of InSb is sliced to a thickness of about several micrometers, and a pattern is formed by means of an evaporation method using a metal mask, or an etching method. For the electrode thin film 4, Cr, Al, Ag or Au, the combination thereof or a conductive paste is used, and for the protective film 5, $SiO_2$ or $Al_2O_3$ are generally used. These materials are deposited using a CVD or RF sputtering method, and then a pattern is formed by photoetching or mask evaporation using a metal mask.

However in the slicing of single crystal InSb to a thickness of about several μm, it is necessary to repeat mechanical polishing and chemical etching processes and the like, thereby not only making the fabrication thereof complex but also causing variations in the thickness of the thin plate to cause large variations in the characteristics of the element. Further, in the mask evaporation method, the temperature distribution is minutely changed in accordance with the formation of the mask, thereby causing a non-uniform characteristic of the evaporation film, and further, non-uniform characteristics of the element due to distortions in mask formation and the pattern in the evaporation process.

Figure 5:
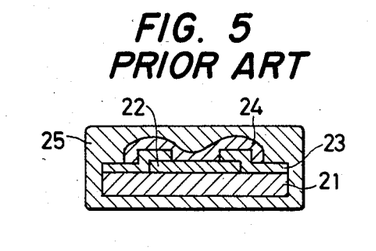
FIGS. 5 and 6 are schematic sectional views of conventional magnetoelectric transducers.

Referring to FIG. 5, an example of a magnetoelectric transducer using a substrate made of mica is shown. In FIG. 5, a semiconductor thin film 22 is formed on the surface of the mica substrate 21, and an electrode thin film 23 is evaporated on a portion of the semiconductor thin film 22 to form a terminal portion. The upper surface of the semiconductor thin film 22 and the electrode thin film 23 thus constructed is coated with a protective film 24, and then the entire assembly is coated with a molding resin 25 to protect the same.

Figure 6:
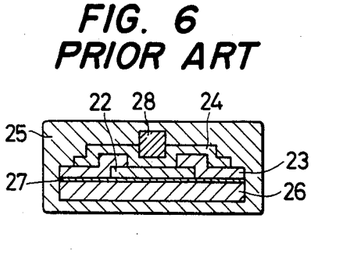

Referring to FIG. 6, the construction of a magnetoelectric transducer using a ferrite substrate 26 is shown. In this magnetoelectric transducer, a film 27 of $Al_2O_3$ is deposited on the surface of the ferrite substrate 26; and the semiconductor layer 22, the electrode thin film 23 and the protective film 24 are formed in the manner shown in FIG. 5. On the protective film 24, a collector 28 is provided at approximately the central portion of the semiconductor thin film 22, and the assembly thus constructed is coated with the molding resin 25.

In the FIG. 5 device using the mica substrate, natural mica is cut into a predetermined form and the surface thereof is cleaned, and it is then cleaved to provide a surface for the semiconductor thin film. The semiconductor thin film 22 is then formed by crystalline growth on the cleaned surface of the mica substrate 1 by means of CVD, an evaporation method or the like. The semiconductor thin film thus constructed is processed to form an element pattern by a method of photoetching or evaporation using a pattern mask. The element formed with the electrode thin film 23 and the protective thin film 24 is cut for each element, and each element is coated with the molding resin 25.

In the magnetoelectric transducer using the ferrite substrate, the above-mentioned manufacturing processes are similarly applied, but the $Al_2O_3$ film is provided on the ferrite substrate in order to facilitate the crystalline growth of the semiconductor thin film, and further, the collector 28 is provided on the semiconductor thin film 23 through the protective film 24 in order to increase the sensitivity thereof.

In the magnetoelectric transducer using the mica substrate, good matching in the crystalline growth of InSb or InAs semiconductor thin films can be obtained, so that carrier mobility of 60,000 $cm^2/V$ sec can be obtained. On the other hand, discontinuity of the evaporated film is caused by a cleavage of the mica, thereby reducing its reliability. Further, upon cutting and separation of each element, cleavage of the mica substrate is undesirably caused thereby reducing the yield. In the magnetoelectric transducer using the ferrite substrate, good matching to the crystalline growth cannot be obtained, so that it is inevitably necessary to increase the sensitivity by sandwiching the semiconductor thin film with high magnetic permeability materials such as ferrite, permalloy and the like, resulting in a complex construction. Further, since the collector is mounted on the upper portion of the semiconductor thin film, the collector is affected by an external force from the molding resin to thereby apply stress to the semiconductive thin film. The semiconductor thin film is thus affected with distortion resistance to thereby produce voltage deviations, which result in a low stability of the element. Further, the ferrite substrate has low heat conductivity, so that the temperature of the element is increased, thereby to reduce the sensivity.

Under this circumstance, one might use a ceramic substrate in order to eliminate the heat problem, however, it is difficult to obtain a large sized substrate because of the difficulty of mirror surface polishing.

SUMMARY OF THE INVENTION

An object of the present invention is to eliminate the above-mentioned drawbacks and to provide a method of producing a magnetoelectric transducer which has fewer steps in its fabrication process and which yields a transducer of uniform characteristics.

To this end, a mask evaporation method and a photoetching method are incorporated into the present invention in a manner such that a semiconductor thin film is simultaneously patterned with an electrode thin film, to thereby reducing the number of steps in fabrication and to achieve a uniform product.

Another object of the present invention is to eliminate the above-mentioned drawbacks and to provide a magnetoelectric transducer having high heat conductivity, manufacturing efficiency and sensitivity.

To achieve this object of the present invention, a silicon substrate with high heat conductivity is used for the magnetoelectric transducer of the present invention, and thin films of $SiO_2$ and $Al_2O_3$ are formed, and a semiconductor thin film is then formed by crystal growth thereon.

Another object of the present invention is to eliminate the drawbacks of conventional Hall effect devices as respects the temperature compensation methods thereof, and to provide a compact Hall element with a stable temperature characteristic and which is mass-producible, by forming a magneto-sensitive portion of the Hall element and a series resistor for temperature compensation on the same substrate.

DETAILED DESCRIPTION OF THE PREFERRED EMBODIMENTS

Figure 2:
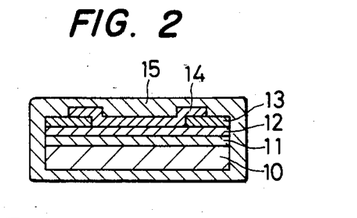
FIGS. 2 and 3 are a schematic sectional view and a plan view of a magnetoelectric transducer produced by the method of the present invention, respectively.
Figure 3:
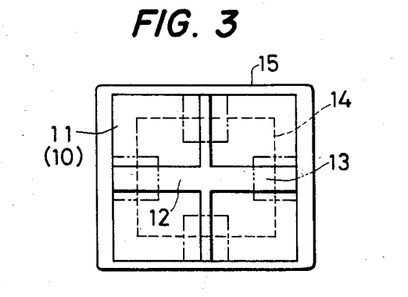

Referring now to FIGS. 2 and 3, a sectional view and a plan view of a magnetoelectric transducer of the present invention are shown, respectively. In FIGS. 2 and 3, numeral 10 designates the substrate, and on the entire surface of the substrate 10, a base layer 11 is evaporated by means of evaporation methods, CVD or RF sputtering. A semiconductor thin film 12 is formed on the entire surface of the base layer 11 by means of evaporation methods or CVD and the like, and further an electrode thin film 13 is formed on portions of the surface of the semiconductor thin film 12.

Further, a protective thin film 14 is formed on portions of the surface of the electrode thin film 13, and the periphery of the above-described assembly is integrally enveloped by a molding resin 15. The magnetoelectric transducer thus constructed is, more particularly, fabricated according to the following process.

Figures 4A, 4D:
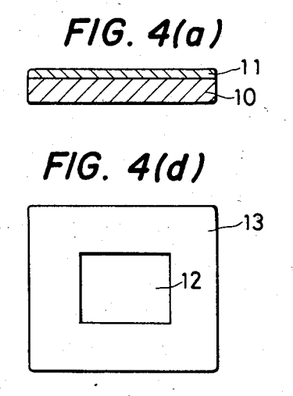
FIGS. 4(a) to 4(f) show the process of formation of the magnetoelectric transducer of the present invention.
Figure 4B:
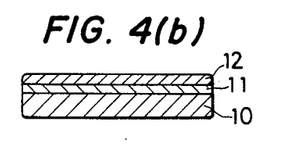
Figure 4C:
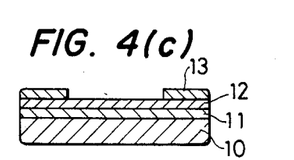
Figure 4E:
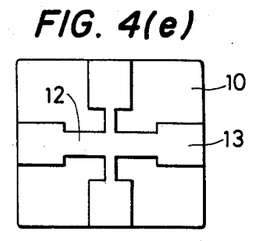
Figure 4F:
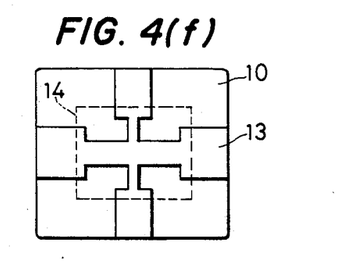

Referring to FIG. 4(a), initially the base layer 11 is evaporated on the entire surface of the substrate 10 by an evaporation method, CVD or RF sputtering, and the semiconductor thin film 12 is then grown on the entire surface of the base layer 11 as shown in FIG. 4(b). The electrode thin film 13 is then evaporated on the surface of the semiconductor thin film 12, a portion of which is retained using a mask, as shown in FIGS. 4(c) and 4(d). Further, a pattern is simultaneously formed on the semiconductor thin film 12 and the electrode thin film 13 using the same pattern mask by a photoetching method, as shown in FIG. 4(e). Then, as shown in FIG. 4(f), the protective film 14 is formed on the entire remaining surface of the semiconductor thin film 12, and portions of the electrode film 13 using an evaporation, CVD, or RF sputtering method. Finally, the peripheral surface of the assembly is integrally molded using a molding resin as shown in FIG. 3.

As described above, according to the present invention, pattern formation is simultaneously achieved on the semiconductor thin film and the electrode thin film by a photoetching method. Therefore, according to the present invention which effects simultaneous patterning, no deviation in position is in any way produced, thereby eliminating a trimming process, which trimming process has been necessary for adjusting an offset voltage due to a deviation in position of the Hall element. Further, the present invention has advantages such that precision in pattern formation is sufficiently obtained in the evaporation of the electrode thin film and the protective thin film, and further, pattern deformation and the spread of evaporated material due to deviation of the mask pattern in evaporation are in no way produced.

Figure 7:
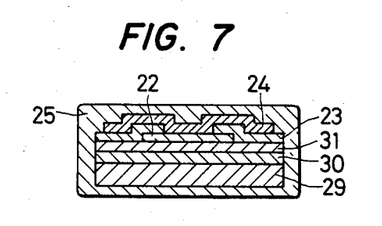
FIG. 7 is a schematic sectional view of another embodiment of the magnetoelectric transducer according to the present invention.

Referring now to FIG. 7, a schematic sectional view of another embodiment of the magnetoelectric transducer of the present invention is shown, in which the same parts as in FIG. 5 are denoted by the same numerical references. In FIG. 7, numeral 29 designates a Si substrate with a polished mirror surface; 30, a $SiO_2$ film deposited using sputtering, evaporation, heat oxidization, and CVD methods or the like; and 31, an $Al_2O_3$ film deposited on the surface of the $SiO_2$ film 30 by a similar method. A semiconductor thin film 22, an electrode thin film 23 and a protective film 24 are formed in the stated order on the surface of the $Al_2O_3$ film 11 by means of usual methods, and the periphery of the assembly thus concentrated is covered with a molding resin 5.

In the magnetoelectric transducer thus constructed, the substrate is a Si-substrate such as is used for IC's and LSI's or a Si-polycrystal substrate, so that the transducer is provided with very good heat conductivity. Accordingly, incremental temperature increases rarely occur. On the surface of the Si-substrate 29 there is provided the $SiO_2$ film 30, the $Al_2O_3$ film 31, and then the semiconductor thin film 22, so that the crystalline growth of the semiconductor thin film 22 is remarkably increased. For example, in a InSb-film a carrier mobility of 30,000 cm$^2$/V sec can be obtained, to thereby provide an element having high sensitivity.

Figure 8:
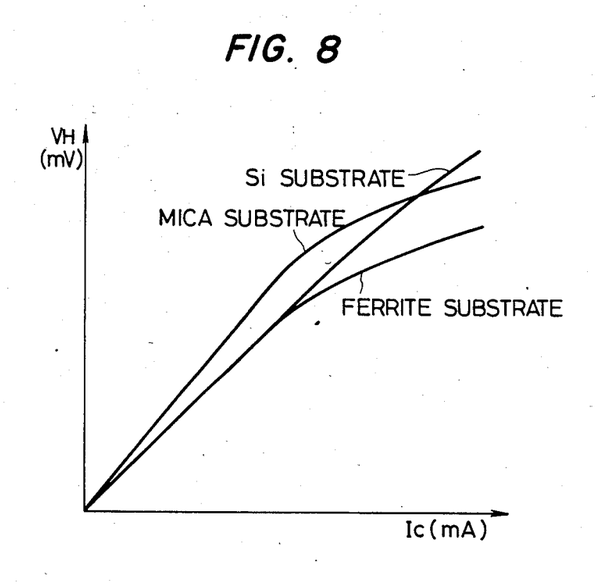
FIG. 8 is a graph showing the characteristics of the magnetoelectric transducer of the present invention in comparison with conventional transducers of this type.

Referring to FIG. 8, the characteristic of elements using the mica substrate, the Si-substrate and the ferrite substrate are shown. In FIG. 8, with the elements using the mica substrate and the ferrite substrate, respectively, it is apparent that the sensitivity thereof is reduced with a change in the temperature due to the low heat conductivity thereof. On the other hand, with the element using the Si substrate, no reduction in sensitivity due to heat is exhibited.

In the above-described embodiment, a magnetoelectric transducer using a Si substrate is explained, but other materials having high heat conductivity, such as Al, Cu or the like may similarly be used as a substrate. In the above embodiment, films of $SiO_2$ and $Al_2O_3$ were formed on the substrate, but the film of $SiO_2$ may be omitted if desired.

According to the magnetoelectric transducer of the present invention, since a substrate having a high heat conductivity such as a Si substrate is used, and since an $Al_2O_3$ film is formed on the substrate, a semiconductor thin film having a high crystalline characteristic can easily be obtained, and heat generation of the element can be prevented. Furthermore, the sensitivity of the element can be remarkably increased. Also, since a Si substrate or the like is used, a highly sensitive element amenable to highly efficient mass-production can easily be obtained.

Figure 9A:
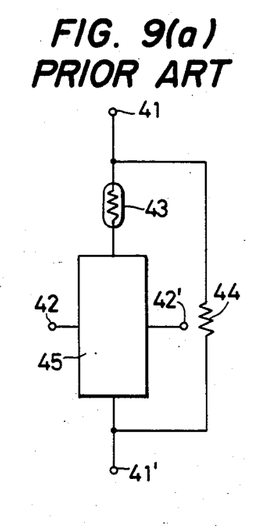
FIGS. 9(a), 9(b) and 9(c) show conventional temperature compensating circuits.
Figures 9B, 9C:
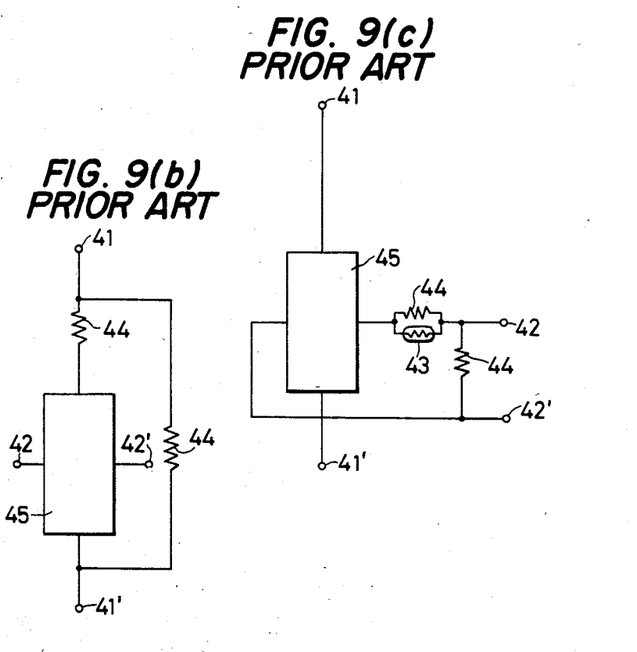
Figure 10:
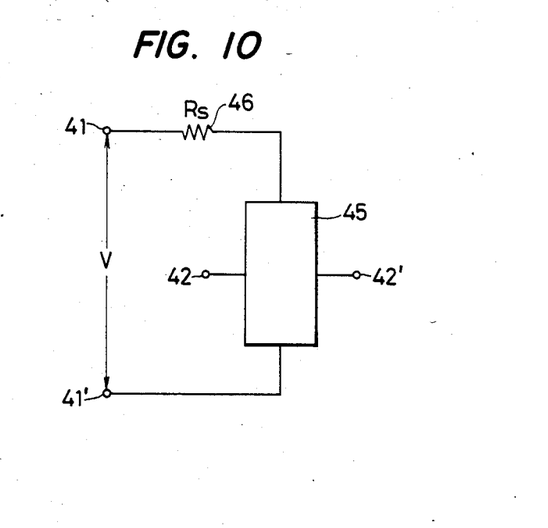
FIG. 10 is a circuit diagram for explaining the principles of a temperature compensation circuit of the invention.

A further aspect of the invention, respecting temperature compensation of the Hall element, will now be described. A thin film Hall element obtained by evaporation of an intermetallic compound such as indiuman-timony InSb, has a high mobility to thereby allow the Hall element to produce a large output voltage. The configuration of such an element can be arbitrarily chosen to thereby easily effect mass-production and reduce the cost thereof. On the other hand, however, the dependency of the Hall output voltage with temperature is undesirably large because the Hall coefficient and the resistance ratio of the element are inherently reduced in accordance with the temperature due to the nature of the material. In InSb, the temperature dependency of a constant current driving element is consistent with that of the Hall element and has a temperature coefficient of about $-2\%/°C$. It is a well-known phenomenon that InSb has a small energy gap of about 0.17 ev, and that electrons are excited from a valence band to a conduction band even with thermal energy of around normal temperatures, whereby the carrier density is greatly changed by even a slight change in temperature. On the other hand, in the case of a constant voltage driving element, the resistance of the Hall element per se is reduced, and the input current is increased, as the temperature rises, and as a result the Hall output voltage is increased. The temperature coefficient is consistent with the Hall mobility, about $+0.2\%/°C$., improved by about one order of magnitude in comparison with the case of the constant current drive. In a conventional means for temperature compensation, suitable impurities such as tellurium, germanium and the like are added in the growing process of InSb, to expand the carrier exhaustion range up to normal temperature; or alternatively, temperature compensation is effected by an external circuit connected to the Hall element. In the former case, the physical properties of the film are changed in accordance with the amount of impurity added, to thereby create a difficult control problem, and the Hall output voltage becomes undesirably small because of the reduction of the mobility due to the addition of the impurity. On the other hand, in the latter case, a compensating circuit as shown in FIGS. 9(a), 9(b) or 9(c) is used. In the compensation circuit, a thermistor 43 having a negative resistance-temperature coefficient and a nickel-manganese resistor 44 having a positive resistance-temperature coefficient are respectively inserted between input terminals 41—41' and output terminals 42—42' of an active element 45, in order to adjust the input current of the element 45 in accordance with the temperature deviation. Especially in the case where the Hall 45 is driven by a constant voltage, temperature compensation can be achieved by connecting a resistor 46, the resistive value of which is constant regardless of temperature, to the input side 41—41' in series as shown in FIG. 10. This method can produce a compensation effect by means of a compact circuit configuration.

The principles of temperature compensation will be explained hereinafter with respect to FIG. 10. In the Hall element drive with a constant voltage V, the output $V_H$ is as follows:

$$V_H = R_H/t \cdot V/R_{IN} \cdot B \qquad (1)$$

where $R_H$ is the Hall coefficient; t, the thickness of the element; $R_{IN}$, the resistance between the input terminals i.e. the input resistance; and B, an external magnetic field.

The Hall coefficient $R_H$ and the resistance $R_{IN}$ have the following temperature dependencies, respectively.

$$R_H = R_{HO} e^{-\alpha T} \qquad (2)$$

$$R_{IN} = R_{INO} e^{-\beta T} \qquad (3)$$

where $R_{HO}$ is the Hall coefficient at 0° C.; $R_{INO}$, the input resistance at 0° C.; $\alpha$, the temperature coefficient of the Hall coefficient; and $\beta$, the temperature coefficient of the input resistance.

If equation (1) is rearranged by substituting equations (2) and (3) thereinto:

$$V_H = \frac{V \cdot B}{t} \cdot \frac{R_{HO}}{R_{INO}} \cdot e^{(\beta - \alpha)T} \qquad (4)$$

where the values $\alpha$ and $\beta$ are $\alpha \approx 0.014/°C$. and $\beta \approx 0.017/°C$., respectively. Therefore, the difference $\beta - \alpha$ becomes about $0.003/°C$., and the temperature characteristic is thus improved in comparison with the temperature characteristic in the case of a constant current drive due to the temperature coefficient 0.014 of the Hall coefficient. In order to reduce the temperature coefficient, a series resistor $R_S$ can be inserted into the element. In this case, the Hall voltage is:

$$V_H = \frac{V \cdot B}{t} \cdot \frac{R_H}{R_S + R_{IN}} \qquad (5)$$

$$R_S = K_S R_{INO} \qquad (6)$$

where $K_S$ is a coefficient of the compensating resistor.

By rearrangement of equation (5), the following equations are obtained.

$$V_H = \frac{V \cdot B}{t} \cdot \frac{R_{HO}}{R_{INO}} \cdot \frac{e^{-\alpha T}}{K_S + e^{-\beta T}} \quad (7)$$

Therefore, $$V_H \propto \frac{e^{-\alpha T}}{K_S + e^{-\beta T}} \quad (8)$$

The value $K_S$ can be obtained by setting the right side of equation (8) equal at the two temperatures $T_1$ and $T_2$, where $T_1$ and $T_2$ are respectively the lower and upper limits of the temperature at which the element is used.

Figure 11:
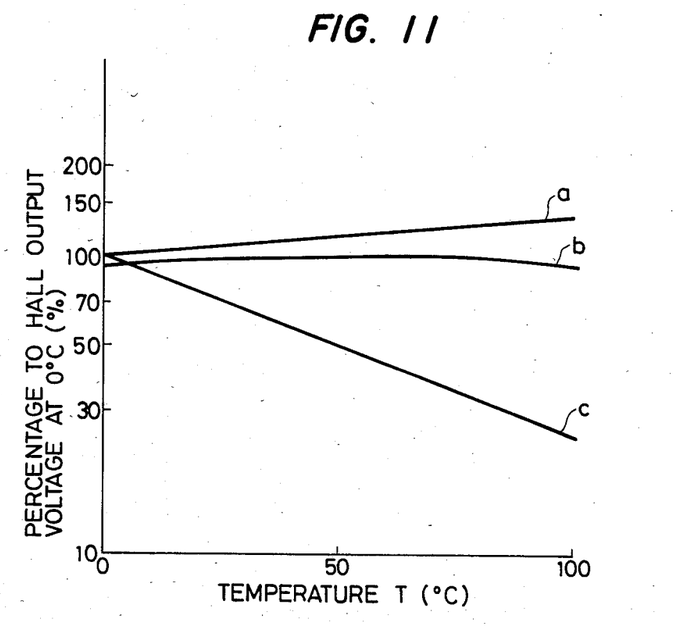
FIG. 11 is a graph showing the temperature compensation effects due to the series resistor.

For example, when $T_1 = 0°$ C., $T_2 = 100°$ C., $\alpha \simeq 0.014/°$C. and $\beta \simeq 0.017/°$C., $K_S$ becomes 0.085. The temperature characteristic at this time is shown in FIG. 3. In FIG. 11, curve a shows the temperature characteristic without the insertion of the compensating resistor and curve b shows that with the insertion thereof, and curve c shows the characteristic in the constant current drive mode. As is apparent from FIG. 11, compensation effects over a wide range of temperature are obtained by a simple circuit construction having a resistor connected in series with the input terminals of the Hall element.

However, according to such a temperature compensation device, it is inevitably necessary to connect the elements to be used for compensation, such as the thermistor, nickel resistor, the series resistor or the like to the Hall element per se, thereby providing a complex circuit configuration. Further, when using a thermistor or nickel resistor, temperature compensation can be achieved in a narrow range of 0°–40°, however, it is undesirably difficult to do so in a wider range covering high temperature regions.

Figure 12:
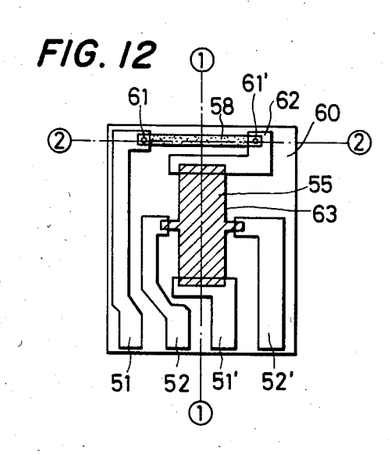
FIG. 12 is a plan view of the Hall element of the present invention.
Figure 13A:
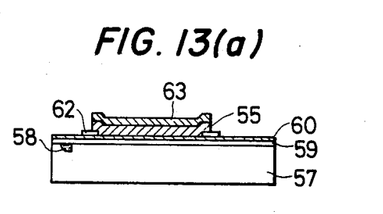
FIGS. 13(a) and 13(b) are sectional views taken along lines 1—1 and 2—2 of FIG. 12, respectively.
Figure 13B:
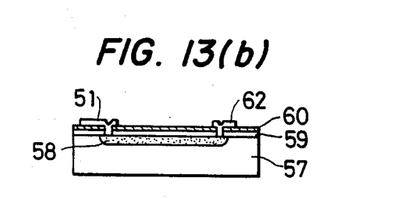

An embodiment of the present invention intended to correct these shortcomings will now be explained with reference to FIGS. 12-15. FIG. 12 is a plan view of the magnetoelectric transducer according to this embodiment of the present invention, and FIGS. 13(a) and 13(b) are sectional views along lines 1—1 and 2—2 of FIG. 12, respectively. In FIG. 13(b) numeral 57 designates a polycrystalline silicon substrate polished to provide a specular surface or a Si semiconductor substrate composed of single crystalline silicon, having a predetermined conductivity type and crystal orientation, such as a single crystal silicon with a crystal orientation (1,0,0) or (1,1,0) and a thickness or 400μ. Numeral 59 denotes a SiO$_2$ film with a thickness of 6000 Å formed on the surface of the Si substrate 57 by RF sputtering, evaporation, heat oxidation, CVD or the like.

Further a base film 60 of Alumina Al$_2$O$_3$ with a thickness 3000 Å is then formed by RF sputtering, evaporation, CVD or the like, and contact holes 61 and 61' used for electrodes of a diffusion resistance portion 58 are formed by photolithography. A conductive metal such as Cu, Al, Au or Cr is evaporated and formed into a pattern, and electrode portions 51, 51', 52, 52', and 62 are formed. The electrode portion 62 is provided for the purpose of electric connection between the diffusion resistor 58 and the electrode portions of the Hall element.

Further, the semiconductor thin film 55 composed of an intermetallic compound such as InSb is evaporated to a thickness of 1μ, and is formed with a predetermined pattern using a photomask. Numeral 63 denotes a protective film such as Al$_2$O$_3$ with a thickness of 5000 Å, which is used to coat the entire surface of the semiconductor thin film 55, or which may be utilized as a pattern mask in the etching process by using a photo-sensitive polymer resin 63, such as cyclized polybutaniene resin, or an aromatic polyimide resin with photo-sensitive performance.

In the use of the Hall element of the present invention, the operation is basically the same as where the series resistor $R_S$ is inserted thereinto, as described above. Knowing the temperature coefficients $\alpha$ and $\beta$ of the Hall coefficient and the resistance, the compensation resistor coefficient $K_S$ can be obtained by the following equation:

$$K_S = \frac{e^{-(\alpha T_2 + \beta T_1)} - e^{-(\alpha T_1 + \beta T_2)}}{e^{-\alpha T_1} - e^{-\beta T_2}} \quad (9)$$

where $T_1$ and $T_2$ are respectively the lower and upper limits of the temperature at which the element is used, as mentioned above.

The value of the series resistor can be obtained from $K_S$, using equations (9) and (6).

It is necessary in manufacturing the diffusion resistor using silicon to take into consideration the application of the Hall element, the precision of the resistance value, the resistance-temperature coefficient, processing numbers and the like. For example, in the case of a P-type Si substrate, phosphorus is diffused into the P-type Si substrate 57 having a suitable resistance ratio by means of the heat diffusion method, to form an N+ region 58 and the resistor is completed merely by providing electrodes at suitable positions within the above region 58. Further, the resistance value may be selectively set by changing the ratio of the geometrical dimensions of the N+ region 58. The N+ region may be provided by an ion injection method as well.

In the diffusion resistor provided by the above-described method, the deviation with temperature is as follows:

$$\frac{R_S(70° \text{ C.})}{R_S(25° \text{ C.})} = 1.023$$

$$\frac{R_S(-30° \text{ C.})}{R_S(25° \text{ C.})} = 0.895$$

where $R_S(T°\text{C.})$ is the value of $R_S$ at the given temperature T°C. and has a positive temperature coefficient. In this case, the reduction of the Hall voltage becomes slightly larger at high temperature regions in comparison with the case where the value $R_S$ is constant regardless of the temperature.

Figure 14:
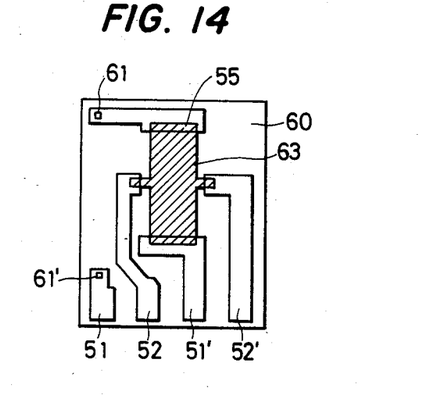
FIGS. 14 and 15(a) are plan views of Hall elements of additional embodiments of the present invention.

In the above-described embodiment, the temperature compensating resistor on the Si substrate is provided by a heat diffusion method or by ion injection, however, the Si substrate per se may be utilized as a compensating resistor as shown in FIG. 14. The compensating resistor is that between the contact holes 61 and 61' on the substrate, and the position of the contact hole 61 may be determined on the basis of the value of the sheet resistance of the substrate per se, and the designed resistance value. According to this method, the number of manufacturing processes can be greatly reduced, and a simple and compact element can be obtained.

Figure 15A:
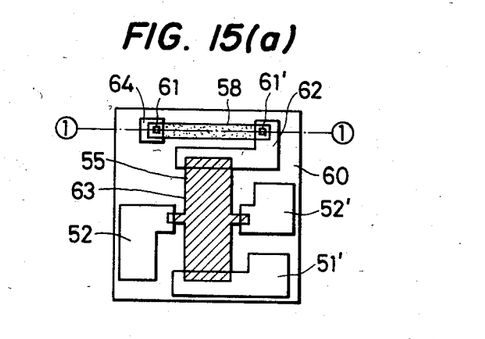
Figure 15B:
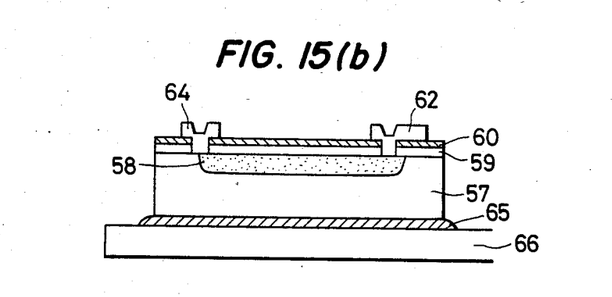
FIG. 15(b) is a sectional view taken along line 1—1 of FIG. 15(a).

In the above two embodiments of the present invention, lead members are used for electrodes, however, a configuration as shown in FIGS. 15(a) and 15(b) may be used to minimize the size of the Hall element and reduce the manufacturing cost thereof. Namely, in FIGS. 15(a) and 15(b), the Si substrate 57 and the diffusion resistor 58 are electrically connected by the electrode film 64, and the element chip is fixed to a lead frame 66 by a conductive paint 65, and the lead frame 66 is electrically connected to the electrode film 64. In this connection, a bonding method may be used.

As described above, according to this aspect of the present invention there is provided an InSb-hybrid type Hall element capable of temperature compensation, with a simple, small-size and low cost configuration, the Hall element being capable of restricting its output voltage change due to a change in the temperature thereof, merely by the formation of a compensating resistor in series on the same substrate, without using an external circuit for this purpose.

Further, there is provided a magnetoelectric transducer in which a temperature compensating circuit is incorporated into the element so as to compensate a Hall element of the device.

What is claimed is:

1. A magnetoelectric transducer including a semiconductor material having high mobility, comprising a substrate having a high heat conductivity, an alumina film formed on said substrate, and a semiconductor thin film comprising said high mobility semiconductor material formed on the surface of said alumina film, wherein said substrate is coated with a silicon oxide film, said alumina film being formed on said silicon oxide film.

2. A magnetoelectric transducer comprising; a silicon semiconductor substrate, a silicon oxide film coated on said substrate, an insulating alumina film formed on said silicon oxide film, a magnetic sensor comprising a semiconductor thin film having a high mobility and formed on said insulating alumina film, and a resistive element connected to an input terminal of said magnetic sensor, said resistive element being formed on said substrate.

3. A magnetoelectric transducer as claimed in claim 2, said resistive element comprising temperature compensation means for said magnetic sensor.

4. A magnetoelectric transducer as claimed in claim 2, said magnetic sensor comprising a Hall effect element, and said resistive element comprising temperature compensation means for said Hall effect element.

5. A magnetoelectric transducer as claimed in claim 2, said resistive element being connected in series with said magnetic sensor.

6. A magnetoelectric transducer as claimed in claim 2, said resistive element comprising a diffusion region of said substrate.

7. A magnetoelectric transducer as claimed in claim 2, said resistive element comprising a temperature compensation element for said magnetic sensor and being electrically connected in series therewith, said resistive element comprising a portion of said substrate.

8. A magnetoelectric transducer as claimed in claim 7, said resistive element comprising a diffusion region of said substrate.

9. A magnetoelectric transducer, comprising; a silicon semiconductor substrate, an insulating alumina film formed on said silicon semiconductor substrate, a magnetic sensor comprising a semiconductor thin film having a high mobility and formed on said insulating film, and means for temperature compensation of said magnetic sensor, said temperature compensation means being formed on said substrate.

10. A magnetoelectric transducer as claimed in claim 9, said temperature compensation means comprising a resistive element.

11. A magnetoelectric transducer as claimed in claim 10, said resistive element comprising a part of said substrate.

12. A magnetoelectric transducer as claimed in claim 11, said resistive element comprising a diffusion region of said substrate.

13. A magnetoelectric transducer as claimed in claim 9, said resistive element being connected in series with said magnetic sensor.

14. A magnetoelectric transducer as claimed in claim 9, said magnetic sensor comprising a Hall effect element, and said temperature compensation means comprising a resistive element formed on said substrate and connected in series therewith.

15. A magnetoelectric transducer, comprising
a substrate of silicon of high heat conductivity and having a polished mirror surface,
a layer of silicon oxide coated on said substrate,
an alumina layer formed on said layer of silicon oxide, and
a semiconductor thin film of high mobility formed on the surface of said alumina.

* * * * *